(12) United States Patent
Xu et al.

(10) Patent No.: US 12,721,122 B2
(45) Date of Patent: Aug. 25, 2026

(54) METHOD FOR METAL GAPFILL

(71) Applicant: Applied Materials, Inc., Santa Clara, CA (US)

(72) Inventors: Yi Xu, San Jose, CA (US); Yu Lei, Belmont, CA (US); Aixi Zhang, Sunnyvale, CA (US); Bingqian Liu, Sunnyvale, CA (US); Zhimin Qi, Fremont, CA (US); Wei Lei, Campbell, CA (US); Rongjun Wang, Dublin, CA (US)

(73) Assignee: Applied Materials Inc., Santa Clara, CA (US)

( * ) Notice: Subject to any disclaimer, the term of this patent is extended or adjusted under 35 U.S.C. 154(b) by 492 days.

(21) Appl. No.: 18/202,624

(22) Filed: May 26, 2023

(65) Prior Publication Data

US 2024/0395614 A1 Nov. 28, 2024

(51) Int. Cl.

| | |
|---|---|
| ***H10W 20/00*** | (2026.01) |
| ***H10P 14/40*** | (2026.01) |
| ***H10P 14/43*** | (2026.01) |
| ***H10P 14/44*** | (2026.01) |

(52) U.S. Cl.
CPC ......... *H10W 20/056* (2026.01); *H10P 14/412* (2026.01); *H10P 14/43* (2026.01); *H10P 14/44* (2026.01)

(58) Field of Classification Search
None
See application file for complete search history.

(56) References Cited

U.S. PATENT DOCUMENTS 7,365,005 B1 4/2008 Gadgil
10,622,375 B2 4/2020 Chun et al.
10,741,385 B2 8/2020 Pore et al.
11,355,391 B2 6/2022 Cen et al.
2006/0211246 A1* 9/2006 Ishizaka ............ C23C 16/45544 257/E21.171
2008/0003797 A1* 1/2008 Kim .................. H01L 21/28556 438/597
2009/0137117 A1 5/2009 Park et al.
2013/0137262 A1* 5/2013 Satoh ................ H01L 21/28556 438/685
2017/0148670 A1 5/2017 Lei et al.
2019/0067014 A1 2/2019 Shrestha et al.
2021/0123139 A1 4/2021 Zhou et al.
2024/0175120 A1* 5/2024 Yang ................. H01L 21/76876

FOREIGN PATENT DOCUMENTS

KR 10-0525110 B1 11/2005

OTHER PUBLICATIONS

PCT International Search Report and Written Opinion for PCT/US2024/030427 dated Sep. 9, 2024.

* cited by examiner

*Primary Examiner* — Bradley Smith
(74) *Attorney, Agent, or Firm* — Moser Taboada

(57) ABSTRACT

A method of metal gapfill including depositing a metal layer on a dielectric layer present on a field and/or in an opening of a feature via plasma enhanced atomic layer deposition utilizing a metal halide precursor and a plasma comprising hydrogen and a noble gas; and depositing a metal gapfill material on the field and in the opening directly over the metal layer, wherein the metal gapfill material completely fills the opening.

19 Claims, 4 Drawing Sheets

600

602 — DEPOSITING A METAL LAYER ON A DIELECTRIC LAYER PRESENT ON A FIELD AND IN AN OPENING OF A FEATURE, VIA PLASMA ENHANCED ATOMIC LAYER DEPOSITION UTILIZING A METAL PRECURSOR ACCORDING TO FORMULA I;

MXa;
WHEREIN M IS A GROUP 6 THROUGH GROUP 9 METAL;
WHEREIN X IS FLUORINE OR CHLORINE; AND A IS FROM 2 TO 6; AND A PLASMA COMPRISING HYDROGEN AND A NOBLE GAS

↓

604 — DEPOSITING A METAL GAPFILL MATERIAL ON THE FIELD AND IN THE OPENING DIRECTLY OVER THE TUNGSTEN METAL LAYER, WHEREIN THE METAL GAPFILL MATERIAL COMPLETELY FILLS THE OPENING

METHOD FOR METAL GAPFILL

FIELD

Embodiments of the present principles generally relate to methods for gapfill of semiconductor substrates.

BACKGROUND

When semiconductor devices are manufactured, the devices are formed with contacts to allow electrical connectivity to the device by other devices or for electrical connections external to a chip or circuit. The contacts are made with metal materials that promote electrical conductivity. The higher the conductivity, the less the resistivity. The inventors have observed that current manufacturing techniques produce contacts with high resistivity which reduces electrical conductivity and may cause thermal issues due to resistive heating in the contact, resulting in poor performance and reduced reliability.

Thus, the inventors have provided improved methods for gapfill when forming contacts having low resistivity and increased reliability.

SUMMARY

Embodiments of the present disclosure relate to methods for gapfill of features in a substrate. In embodiments, a method for metal gapfill, comprises depositing a metal layer on a dielectric layer present on a field and in an opening of a feature, via plasma enhanced atomic layer deposition utilizing a metal precursor according to formula I;

$MX_a$; (I)

wherein M is a Group 6 through Group 9 metal; wherein X is fluorine or chlorine; and a is from 2 to 6; and a plasma comprising hydrogen and a noble gas; and depositing a metal gapfill material on the field and in the opening directly over the metal layer, wherein the metal gapfill material completely fills the opening.

In embodiments, a method for metal gapfill comprises deposited a base metal layer via physical vapor deposition or chemical vapor deposition on a portion of a dielectric layer present on a field and in an opening of a feature; depositing a conformal metal layer directly on the base metal layer and on a portion of the dielectric layer present on the field and in the opening of the feature via plasma enhanced atomic layer deposition utilizing a metal precursor according to formula I;

$MX_a$; (I)

wherein M is a Group 6 through Group 9 metal;
wherein X is fluorine or chlorine; and
a is from 2 to 6; and an argon-hydrogen plasma; and depositing a metal gapfill material on the field and in the opening directly over the metal layer, wherein the metal gapfill material completely fills the opening; wherein a mass to mass ratio of argon to hydrogen in the argon-hydrogen plasma is from about 1 to 10, to about 10 to 1; and wherein the plasma enhanced atomic layer deposition is conducted at a power of greater than or equal to about 200 watts and less than or equal to about 1600 watts.

In embodiments, a non-transitory, computer readable medium having instructions stored thereon that, when executed, cause a method for metal gapfill to be performed, the method comprising depositing a metal layer on a dielectric layer present on a field and in an opening of a feature, via plasma enhanced atomic layer deposition utilizing a metal precursor according to formula I;

$MX_a$; (I)

wherein M is a Group 6 through Group 9 metal; wherein X is fluorine or chlorine; and a is from 2 to 6; and a plasma comprising hydrogen and a noble gas; and depositing a metal gapfill material on the field and in the opening directly over the metal layer, wherein the metal gapfill material completely fills the opening.

BRIEF DESCRIPTION OF THE DRAWINGS

Embodiments of the present principles, briefly summarized above and discussed in greater detail below, can be understood by reference to the illustrative embodiments of the principles depicted in the appended drawings. The appended drawings illustrate only typical embodiments of the principles and are thus not to be considered limiting of scope, for the principles may admit to other equally effective embodiments.

DETAILED DESCRIPTION

The methods provide for metal gapfill in which the metal gapfill material completely fills the opening of a feature of a substrate.

In embodiments, depositing a metal layer on a dielectric layer present on a field and in an opening of a feature, via plasma enhanced atomic layer deposition utilizing a metal precursor according to formula I;

$MX_a$; (I)

wherein M is a Group 6 through Group 9 metal;
wherein X is fluorine or chlorine; and
a is from 2 to 6; and
a plasma comprising hydrogen and a noble gas; and
depositing a metal gapfill material on the field and in the opening directly over the metal layer, wherein the metal gapfill material completely fills the opening.

In embodiments, the metal precursor comprises tungsten hexafluoride. In embodiments, the plasma is an argon-hydrogen plasma comprising a mass-to-mass ratio of argon to hydrogen from about 1 to 10, to about 10 to 1. In embodiments, the plasma enhanced atomic layer deposition is conducted at a temperature of greater than or equal to about 250° C.; at a pressure from about 0.1 to 250 Torr; at a power of greater than or equal to about 200 watts; or a combination thereof. In embodiments, the metal layer has a thickness of less than or equal to about 15 nm. In embodiments, the metal layer is a conformal metal layer having a thickness from about 5 nm to about 10 nm. In embodiments, the metal layer is tungsten and the metal gapfill material comprises tungsten, consists essentially of tungsten, or consists of tungsten. In embodiments, the depositing of the metal layer via plasma enhanced atomic layer deposition and the depositing of the metal gapfill material is performed in an integrated tool without a vacuum break therebetween. In embodiments, the metal gapfill material is deposited via physical vapor deposition or chemical vapor deposition.

In embodiments, the metal layer is deposited over a base metal layer deposited via physical vapor deposition or chemical vapor deposition on a portion of the dielectric layer present on the field and in the opening of the feature. In embodiments, the base metal layer is deposited anisotropically via physical vapor deposition or chemical vapor deposition, followed by the depositing of the metal layer via plasma enhanced atomic layer deposition, in an integrated process without a vacuum break therebetween. In embodiments, the metal layer is tungsten, the base metal layer is tungsten, and the metal gapfill material is tungsten.

Figure 1:
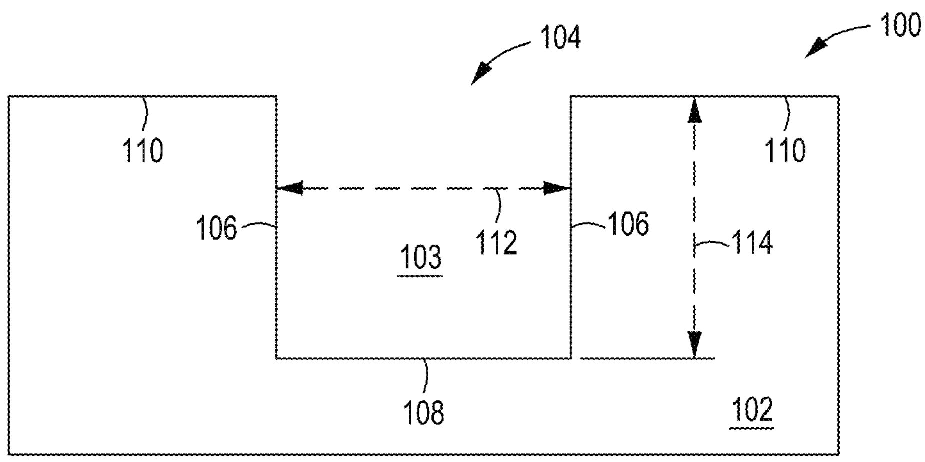
FIG. 1 depicts a cross-sectional view of a feature formed in a substrate in accordance with embodiments disclosed herein.

FIG. 1 depicts a feature of a substrate 100, which may include a feature 104 in the form of an opening 103 having sides 106 and a bottom 108, which is formed on or within a dielectric layer 102 of the substrate 100. The dielectric layer 102 can be any suitable dielectric material typically used in the fabrication of microelectronic devices, such as silicon oxide, or the like. Although not shown, a conductive layer may be disposed within the dielectric layer 102, for example, being exposed at a bottom 108 of the feature 104. The representative feature 104 in the example is an opening 103 in a field 110 of the substrate 100. The feature 104 has a height 114 and a width 112.

Figure 2:
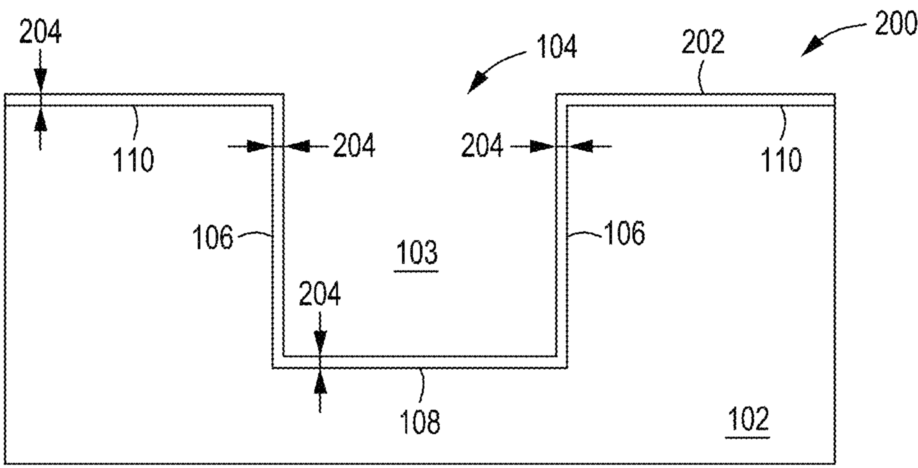
FIG. 2 depicts a cross-sectional view of a dielectric layer deposited on the feature and the substrate in accordance with embodiments disclosed herein.

FIG. 2 depicts the feature 104 of the substrate 100 which further includes a liner, or barrier layer 202, which may be deposited using an atomic layer deposition (ALD) process, a physical vapor deposition (PVD) process, or a chemical vapor deposition (CVD) process. In embodiments, the barrier layer 202 is a conformal layer deposited via atomic layer deposition. In embodiments, the barrier layer may comprise, but is not limited to, titanium nitride, tungsten nitride, and/or tungsten carbon nitride, and the like. The materials used for the barrier layer 202 are generally dielectric materials such as oxides, nitrides, and/or carbides that have high resistivity which decreases the conductivity of a contact. By using a thin layer (i.e., less than approximately 10 microns), the resistivity of the barrier layer 202 is dramatically reduced. Metal deposition, such as by PVD tungsten and CVD tungsten, typically have a resistivity of approximately 15 ohm-cm or less. Whereas titanium nitride has a resistivity of approximately 200 to 600 ohm-cm. Reduction of the thickness of the barrier layer 202 has a dramatic effect on the contact resistivity.

Figure 3:
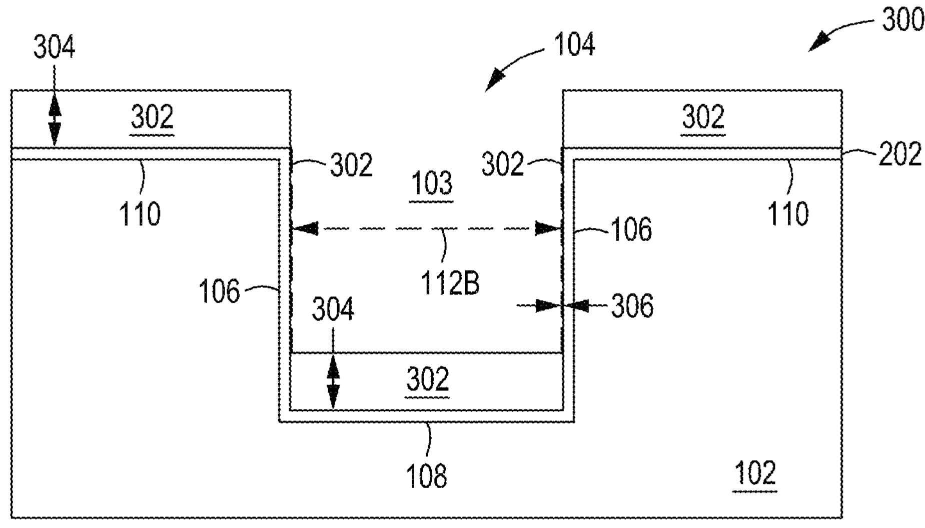
FIG. 3 depicts a cross-sectional view of a base metal layer deposited on the feature and the substrate in accordance with embodiments disclosed herein.

FIG. 3 depicts an embodiment wherein the feature 104 of the substrate 100 further includes a base metal layer 302, which in embodiments is a non-conformal layer deposited on the bottom 108 of the feature 104 and on the field 110 of the substrate 100 using an anisotropic deposition process. Because the deposition process is directional, a first thickness 304 of the base metal layer 302 may be approximately the same on the field 110 of the substrate 100 and on the bottom 108 of the feature 104. In some embodiments, the first thickness 304 may be approximately 30 microns to approximately 50 microns. In some embodiments, the first thickness 304 may be approximately 30 microns to approximately 40 microns. In some embodiments, the first thickness 304 may be approximately 32 microns to approximately 37 microns. As shown in FIG. 3, a second thickness 306 of the base metal layer 302 on the sides 106 of the feature 104 is negligible and may be discontinuous due to the directionality of the deposition process.

In embodiments, the base metal layer 302 may be deposited using a PVD process or the like. In some embodiments, the PVD process is self-biasing to provide the anisotropic non-conformal deposition of the base metal layer 302. In some embodiments, the PVD process may use an applied bias to the substrate to further influence the PVD deposition. The base metal layer 302 forms on the barrier layer 202 on the field 110 of the substrate 100 and on the barrier layer 202 at the bottom 108 of the feature 104. Any deposition of the base metal layer 302 on the barrier layer 202 on the sides 106 of the feature 104 may be discontinuous and is negligible in thickness. In embodiments, the base metal layer 302 is formed from one or more Group 6 through Group 9 metals, such as from tungsten and/or cobalt. In embodiments, the base metal layer 302 is formed from tungsten.

Figure 4:
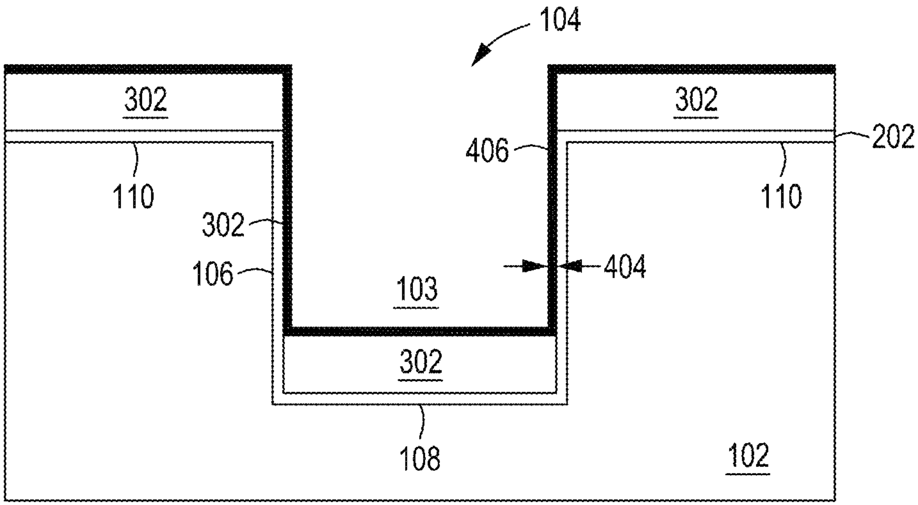
FIG. 4 depicts a cross-sectional view of a metal layer deposited on the base metal layer via plasma enhanced atomic layer deposition in accordance with embodiments disclosed herein.

FIG. 4 depicts depositing a metal layer 406 directly on the barrier layer 202, and directly on the base metal layer 302 present on the field 110 and in an opening 103 of the feature 104 via plasma enhanced atomic layer deposition (PEALD) utilizing a metal precursor according to formula I;

$$MXa; \qquad (I)$$

wherein M is a Group 6 through Group 9 metal;
wherein X is a fluorine or chlorine; and
a is from 2 to 6 in combination with a plasma comprising hydrogen and a noble gas.

For example, the PEALD process may include a plurality of sequential cycles of contacting the substrate with the metal precursor (e.g., a first pulse) followed by contacting the substrate with the plasma comprising hydrogen and a noble gas (e.g., a second pulse). An inert purge gas can be provided between each of the first pulse and the second pulse. In some embodiments, the purge gas can be provided continuously during the PEALD process.

In embodiments, the metal precursor is tungsten hexafluoride, and the noble gas comprises helium and/or argon. In embodiments, the noble gas is argon and the plasma is an argon-hydrogen plasma. In some embodiments, the purge gas is a noble gas. In some embodiments, the purge gas is argon.

The inventors have observed that by using ALD with metal halides, e.g., tungsten hexafluoride in combination with an argon-hydrogen plasma, the tungsten atoms are deposited directly on the barrier layer 202, which is typically present on the sides 106 of the feature 104, and the base metal layer 302 which is typically present on the field 110 and the bottom 108 of the feature 104. As shown in FIG. 3, the base metal layer 302 may be present on a portion of the sides 106. The inventors have observed that by using ALD with metal halides in combination with an argon-hydrogen plasma according to embodiments disclosed herein, a metal layer is formed directly over both the barrier layer 202 and the discontinuous portions of the base metal layer 302, creating a continuous metal seeding layer. In embodiments, the plasma is an argon-hydrogen plasma having a mass-to-mass ratio of argon to hydrogen from about 1 to 10, to about 10 to 1, or from about 1 to 5 to about 5 to 1, or from about 10 to 1 to about 1 to 1 of argon to hydrogen.

In embodiments, the plasma enhanced atomic layer deposition is conducted at a temperature of greater than or equal to about 250° C., or greater than or equal to about 300° C., or greater than or equal to about 350° C., and less than or equal to about 600° C., or less than or equal to about 450° C., or less than or equal to about 400° C.

In embodiments, the plasma enhanced atomic layer deposition is conducted at a pressure from about 0.1 to 250 Torr, or from about 0.1 to 150 Torr, or from about 0.1 to 100 Torr, or from about 0.1 to 10 Torr.

In embodiments, the plasma enhanced atomic layer deposition is conducted at a power of greater than or equal to about 200 watts, or greater than or equal to about 300 watts, or greater than or equal to about 600 watts, and less than or equal to about 1600 watts. In embodiments, the plasma enhanced atomic layer deposition is conducted at a power of greater than or equal to about 200 watts and less than or equal to about 1600 watts.

In embodiments, the metal layer has a thickness of less than or equal to about 15 nm. In embodiments, the metal layer has a thickness of greater than or equal to about 5 nm, and less than or equal to about 10 nm.

Figure 5:
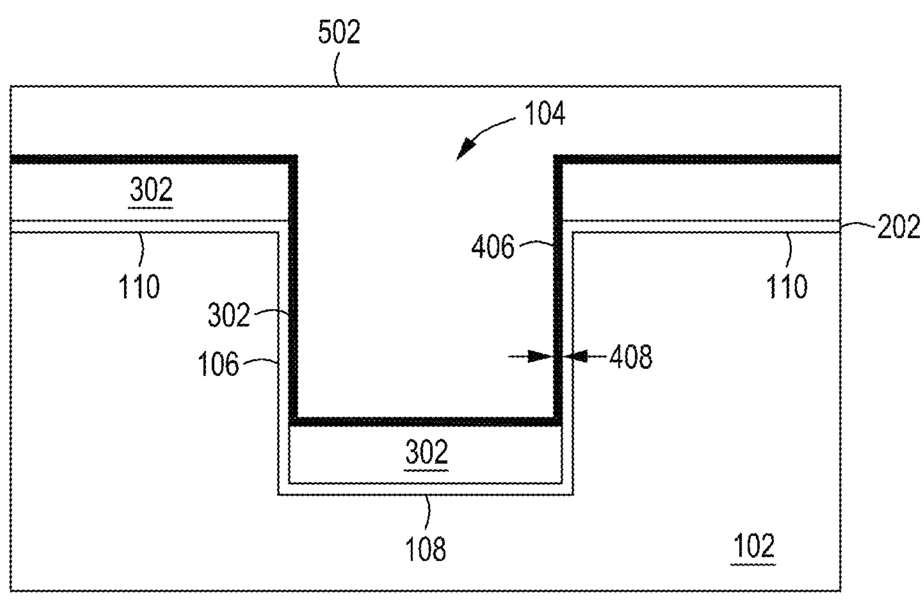
FIG. 5 depicts a metal gapfill material deposited on the metal layer in the feature and on the substrate in accordance with embodiments disclosed herein.

FIG. 5 depicts a metal gapfill material 502 deposited in the opening 103 and on the field 110 directly over the metal layer 406, where the metal gapfill material 502 completely fills the opening 103 of the feature 104.

In embodiments, the metal gapfill material 502 completely fills the opening 103 of the feature 104 without voids. In embodiments, the metal gapfill material 502 may be, but is not limited to, tungsten and/or cobalt and the like. In embodiments, the metal gapfill material 502 comprises tungsten. In embodiments, the metal gapfill material 502 is, or consists essentially of tungsten. In embodiments, the base metal layer 302, the metal layer 406, and the metal gapfill material 502 are all the same metal. In embodiments, each of the base metal layer 302, the metal layer 406, and the metal gapfill material 502 comprise tungsten. In embodiments, each of the base metal layer 302, the metal layer 406, and the metal gapfill material 502 are, or consist essentially of, tungsten. In embodiments, the metal gapfill material 502 is deposited via physical vapor deposition or chemical vapor deposition. In embodiments, the metal gapfill material 502 is deposited via chemical vapor deposition.

The inventors have found that a gapfill method according to embodiments results in an inside structure of all tungsten contact, without a high resistance layer as may result when the metal layer 406 is not deposited directly on the barrier layer 202 present on the field 110 and in an opening 103 of the feature 104 via plasma enhanced atomic layer deposition utilizing tungsten hexafluoride and an argon-hydrogen plasma. Further, the chemical vapor deposition tungsten of the metal gapfill material 502 that grows on the atomic layer deposition tungsten layer 406 has a low resistance of less than about 5 microohms per $mm^2$. Furthermore, the metal gapfill material 502 completely fills the feature 104 without the formation of voids.

Figure 6:
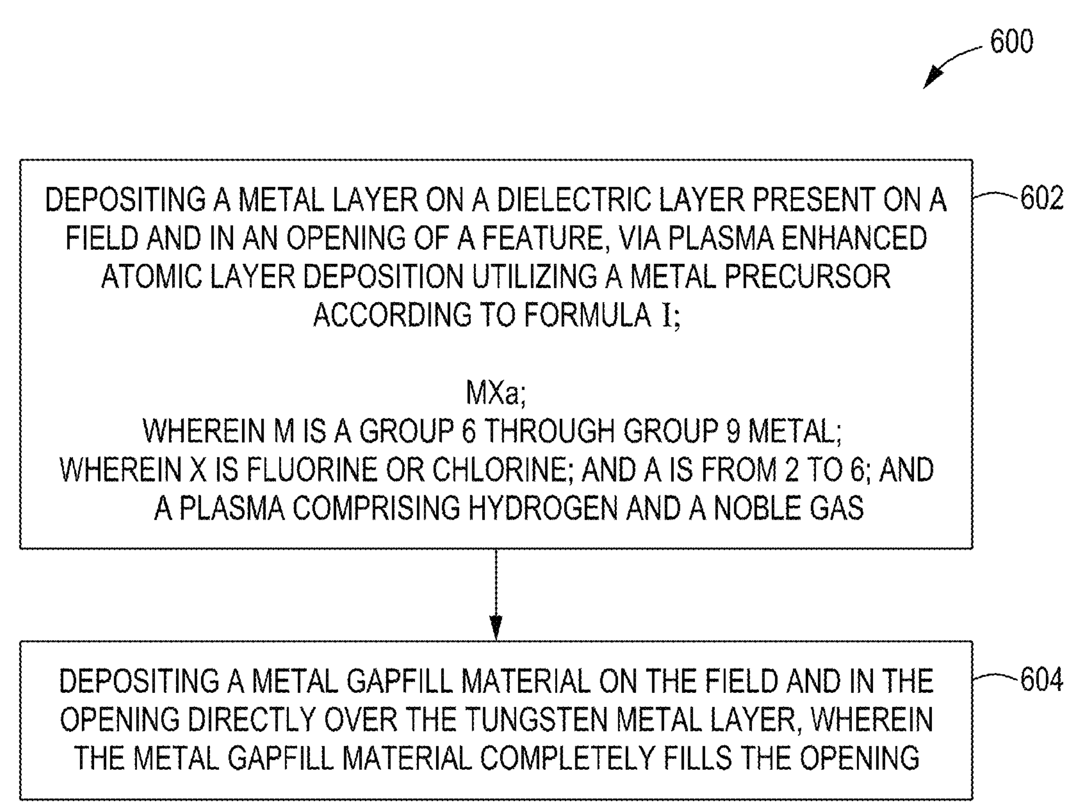
FIG. 6 is a flowchart depicting a method for metal gapfill in accordance with embodiments disclosed herein.

FIG. 6 is a flowchart of a method 600 according to embodiments disclosed herein. The method 600 includes depositing a metal layer on a dielectric layer present on a field and in an opening of a feature, via plasma enhanced atomic layer deposition utilizing a metal precursor according to formula I:

$$MX_a; \tag{I}$$

wherein M is a Group 6 through Group 9 metal;

wherein X is fluorine or chlorine; and a is from 2 to 6; and a plasma comprising hydrogen and a noble gas (block 602). Method 600 further includes depositing a metal gapfill material on the field and in the opening directly over the metal layer, where the metal gapfill material completely fills the opening. In embodiments, method 600 may include additional blocks than those depicted in FIG. 6.

Figure 7:
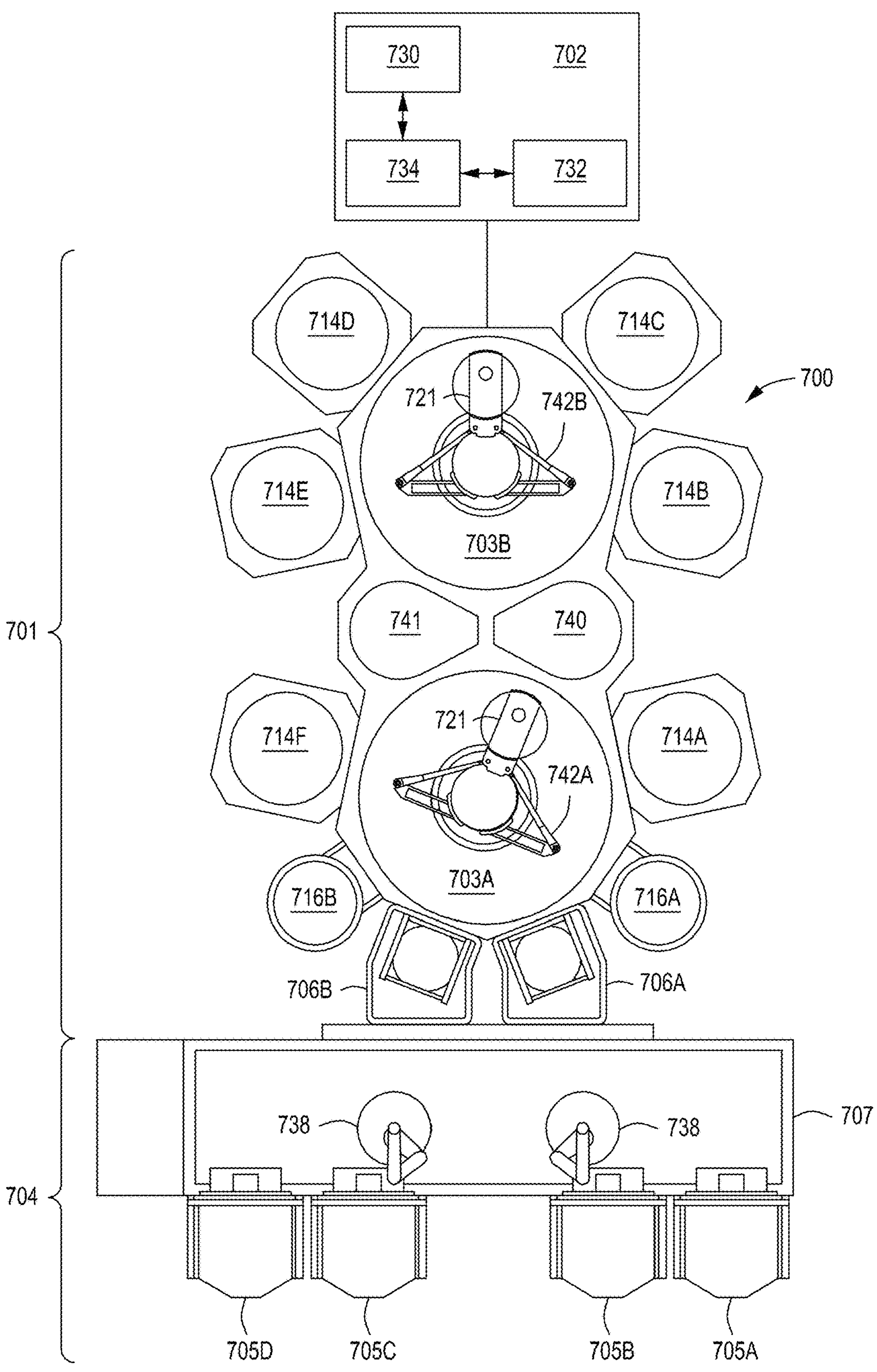
FIG. 7 depicts an integrated tool in accordance with embodiments disclosed herein.

The methods described herein may be performed in individual process chambers that may be provided in a standalone configuration or as part of a cluster tool, for example, the integrated tool 700 (i.e., cluster tool) described below with respect to FIG. 7. In embodiments, the method 600 according to one or more embodiments is performed in an integrated tool without vacuum break between the depositing of the metal layer 406, and the depositing of the metal gapfill material 502. The advantage of using an integrated tool 700 is that there is no vacuum break between chambers and, therefore, no requirement to degas and pre-clean a substrate before treatment in a chamber. For example, in some embodiments the methods discussed above may advantageously be performed in an integrated tool such that there are limited or no vacuum breaks between processes, limiting or preventing contamination of the substrate such as oxidation and the like. The integrated tool 700 includes a vacuum-tight processing platform 701, a factory interface 704, and a system controller 702. The processing platform 701 comprises multiple processing chambers, such as 714A, 714B, 714C, 714D, 714E, and 714F operatively coupled to a vacuum substrate transfer chamber (transfer chambers 703A, 703B). The factory interface 704 is operatively coupled to the transfer chamber 703A by one or more load lock chambers (two load lock chambers, such as 706A and 706B shown in FIG. 7).

In some embodiments, the factory interface 704 comprises at least one docking station 607, at least one factory interface robot 738 to facilitate the transfer of the semiconductor substrates. The docking station 607 is configured to accept one or more front opening unified pods (FOUP). Four FOUPS, such as 705A, 705B, 705C, and 705D are shown in the embodiment of FIG. 7. The factory interface robot 738 is configured to transfer the substrates from the factory interface 704 to the processing platform 701 through the load lock chambers, such as 706A and 706B. Each of the load lock chambers 706A and 706B have a first port coupled to the factory interface 704 and a second port coupled to the transfer chamber 703A. The load lock chamber 706A and 706B are coupled to a pressure control system (not shown) which pumps down and vents the load lock chambers 706A and 706B to facilitate passing the substrates between the vacuum environment of the transfer chamber 703A and the substantially ambient (e.g., atmospheric) environment of the factory interface 704. The transfer chambers 703A, 703B have vacuum robots 742A, 742B disposed in the respective transfer chambers 703A, 703B. The vacuum robot 742A is capable of transferring substrates 721 between the load lock chamber 706A, 706B, the processing chambers 714A and 714F and a cooldown station 740 or a pre-clean station 741. The vacuum robot 742B is capable of transferring substrates 721 between the cooldown station 740 or pre-clean station 741 and the processing chambers 714B, 714C, 714D, and 714E.

In some embodiments, the processing chambers 714A, 714B, 714C, 714D, 714E, and 714F are coupled to the transfer chambers 703A, 703B. The processing chambers 714A, 714B, 714C, 714D, 714E, and 714F may comprise, for example, atomic layer deposition process chambers, physical vapor deposition process chambers, chemical vapor deposition chambers, annealing chambers, or the like. The chambers may include any chambers suitable to perform all or portions of the methods described herein, as discussed above, in one or more ALD deposition chambers, non-conformal layer PVD deposition chambers, and CVD deposition chambers, and the like. In some embodiments, one or more optional service chambers (shown as 716A and 716B) may be coupled to the transfer chamber 703A. The service chambers 716A and 716B may be configured to perform other substrate processes, such as degassing, orientation, substrate metrology, cool down, and the like.

The system controller 702 controls the operation of the tool 700 using a direct control of the process chambers 714A, 714B, 714C, 714D, 714E, and 714F or alternatively, by controlling the computers (or controllers) associated with the process chambers 714A, 714B, 714C, 714D, 714E, and 714F and the tool 700. In operation, the system controller 702 enables data collection and feedback from the respective chambers and systems to optimize performance of the tool 700. The system controller 702 generally includes a central processing unit (CPU) 730, a memory 734, and a support circuit 732. The CPU 730 may be any form of a general-purpose computer processor that can be used in an industrial setting. The support circuit 732 is conventionally coupled to the CPU 730 and may comprise a cache, clock circuits, input/output subsystems, power supplies, and the like. Software routines, such as a method as described above may be stored in the memory 734 and, when executed by the CPU 730, transform the CPU 730 into a specific purpose computer (system controller) 702. The software routines may also be stored and/or executed by a second controller (not shown) that is located remotely from the tool 700.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

What is claimed is:

1. A method for metal gapfill, comprising:

depositing a metal layer on a dielectric layer present on a field and in an opening of a feature, via plasma enhanced atomic layer deposition utilizing a metal precursor according to formula I:

$$MX_a; \quad (I)$$

wherein M is tungsten or cobalt, X is fluorine or chlorine, and a is from 2 to 6, and a plasma comprising hydrogen and a noble gas; and depositing a metal gapfill material on the field and in the opening directly over the metal layer, wherein the metal gapfill material completely fills the opening; and wherein the plasma is an argon-hydrogen plasma comprising a mass-to-mass ratio of argon to hydrogen from about 1 to 10, to about 10 to 1.

2. The method of claim 1, wherein the metal precursor comprises tungsten hexafluoride.

3. The method of claim 1, wherein the plasma enhanced atomic layer deposition is conducted at a temperature of greater than or equal to about 250° C., a pressure from about 0.1 to 250 Torr, a power of greater than or equal to about 200 watts, or a combination thereof.

4. The method of claim 1, wherein the metal layer has a thickness of less than or equal to about 15 nm.

5. The method of claim 1, wherein the metal layer is a conformal metal layer having a thickness from about 5 nm to about 10 nm.

6. The method of claim 1, wherein the metal layer is tungsten and the metal gapfill material comprises tungsten.

7. The method of claim 1, wherein the depositing of the metal layer via the plasma enhanced atomic layer deposition and the depositing of the metal gapfill material are performed in an integrated tool without a vacuum break therebetween.

8. The method of claim 1, wherein the metal gapfill material is deposited via physical vapor deposition or chemical vapor deposition.

9. The method of claim 1, wherein the metal layer is deposited over a base metal layer deposited via physical vapor deposition or chemical vapor deposition on a portion of the dielectric layer present on the field and in the opening of the feature.

10. The method of claim 9, wherein the base metal layer is deposited anisotropically via physical vapor deposition or chemical vapor deposition, followed by the depositing of the metal layer via the plasma enhanced atomic layer deposition, in an integrated process without a vacuum break therebetween.

11. The method of claim 9, wherein the metal layer is tungsten, the base metal layer is tungsten, and the metal gapfill material is tungsten.

12. A method for metal gapfill, comprising:

deposited a base metal layer via physical vapor deposition or chemical vapor deposition on a portion of a dielectric layer present on a field and in an opening of a feature;

depositing a conformal metal layer directly on the base metal layer and on a portion of the dielectric layer present on the field and in the opening of the feature via plasma enhanced atomic layer deposition utilizing a metal precursor according to formula I:

$$MX_a; \quad (I)$$

wherein M is tungsten or cobalt, X is fluorine or chlorine, and a is from 2 to 6, and an argon-hydrogen plasma; and depositing a metal gapfill material on the field and in the opening directly over the metal layer, wherein the metal gapfill material completely fills the opening;

wherein a mass-to-mass ratio of argon to hydrogen in the argon-hydrogen plasma is from about 1 to 10, to about 10 to 1; and wherein the plasma enhanced atomic layer deposition is conducted at a power of greater than or equal to about 200 watts and less than or equal to about 1600 watts.

13. The method of claim 12, wherein the metal precursor is tungsten hexafluoride.

14. The method of claim 12, wherein the metal gapfill material is tungsten.

15. The method of claim 12, wherein the base metal layer is tungsten, and wherein the base metal layer is deposited anisotropically via physical vapor deposition or chemical vapor deposition, followed by the depositing the metal layer via the plasma enhanced atomic layer deposition, followed by the deposition of the metal gapfill material in an integrated process without a vacuum break therebetween.

16. The method of claim 12, wherein the metal gapfill material is deposited via physical vapor deposition or chemical vapor deposition.

17. The method of claim 12, wherein the plasma enhanced atomic layer deposition is conducted at a temperature of greater than or equal to about 250° C. and wherein the plasma enhanced atomic layer deposition is conducted at a pressure from about 0.1 to 250 Torr.

18. A non-transitory, computer readable medium having instructions stored thereon that, when executed, cause a method for metal gapfill to be performed, the method comprising:

depositing a metal layer on a dielectric layer present on a field and in an opening of a feature, via plasma enhanced atomic layer deposition utilizing a metal precursor according to formula I:

$$MX_a; \quad \text{(I)}$$

wherein M is tungsten or cobalt, X is fluorine or chlorine, and a is from 2 to 6; and a plasma comprising hydrogen and a noble gas; and depositing a metal gapfill material on the field and in the opening directly over the metal layer, wherein the metal gapfill material completely fills the opening; and wherein the plasma is an argon-hydrogen plasma comprising a mass-to-mass ratio of argon to hydrogen from about 1 to 10, to about 10 to 1.

19. The non-transitory, computer readable medium having instructions stored thereon that, when executed, cause the method for metal gapfill to be performed of claim 18, wherein the method further comprises depositing a base metal layer via physical vapor deposition or chemical vapor deposition on a portion of the dielectric layer present on the field and in the opening of the feature prior to the depositing of the metal layer on the dielectric layer present on the field and in the opening of the feature via the plasma enhanced atomic layer deposition.

* * * * *